US 8,628,647 B2

(12) United States Patent
Meyer

(10) Patent No.: US 8,628,647 B2
(45) Date of Patent: Jan. 14, 2014

(54) ARRANGEMENT FOR THE SEPARATION OF PARTICLES FROM A PLASMA

(75) Inventor: Carl-Friedrich Meyer, Dresden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 1406 days.

(21) Appl. No.: 11/709,283

(22) Filed: Feb. 22, 2007

(65) Prior Publication Data

US 2007/0209934 A1     Sep. 13, 2007

(30) Foreign Application Priority Data

Feb. 22, 2006   (DE) .......................... 10 2006 009 160

(51) Int. Cl.
*C23C 14/24*     (2006.01)
*C23C 14/28*     (2006.01)

(52) U.S. Cl.
USPC .......... 204/298.41; 204/298.06; 118/723 VE; 118/723 MP

(58) Field of Classification Search
USPC ................ 204/298.06, 298.41; 427/580, 596; 118/723 VE, 723 FI, 723 MP
See application file for complete search history.

(56) References Cited

U.S. PATENT DOCUMENTS

| | | | |
|---|---|---|---|
| 4,180,450 A * | 12/1979 | Morrison, Jr. .......... | 204/298.19 |
| 4,929,321 A | 5/1990 | Buhl | |
| 5,158,660 A * | 10/1992 | Devigne et al. .......... | 204/298.21 |
| 5,688,388 A * | 11/1997 | Bahr et al. ............... | 204/298.22 |
| 5,840,163 A | 11/1998 | Welty | |
| 5,902,462 A | 5/1999 | Krauss | |
| 6,024,851 A * | 2/2000 | Radhakrishnan ........ | 204/298.02 |
| 6,533,908 B1 * | 3/2003 | Meyer et al. ............. | 204/192.37 |
| 2002/0007796 A1 | 1/2002 | Gorukovsky | |
| 2007/0256927 A1 * | 11/2007 | Vetter ...................... | 204/192.12 |

FOREIGN PATENT DOCUMENTS

| | | |
|---|---|---|
| DE | 10240337 | 4/2004 |
| WO | WO 00/13201 | 3/2000 |
| WO | WO 2006/000862 | * 5/2005 |

OTHER PUBLICATIONS

Machine Translation to Meyer (DE 10240337 cited on IDS May 22, 2007) published Apr. 2004.*

* cited by examiner

*Primary Examiner* — John Brayton
(74) *Attorney, Agent, or Firm* — Jacobson Holman PLLC

(57) ABSTRACT

An arrangement for the separation of particles from plasma for the formation of a coating onto the surface of a substrate under vacuum conditions. The plasma is advantageously formed by electrical arc discharge. The plasma is formed from a target that can be connected as a cathode and positive charge carriers of the plasma are accelerated in the direction of a surface of a substrate to be coated by at least one absorber electrode connected to an electrical potential that is positive with respect to the plasma. The absorber electrode is arranged and orientated such that a direct incidence of plasma onto the absorber electrode is avoided and can be designed in plate form aligned at an obliquely inclined angle which takes account of the divergence of the plasma flow. In addition, at least one permanent magnet or electromagnet element is a component of the arrangement.

15 Claims, 6 Drawing Sheets

ARRANGEMENT FOR THE SEPARATION OF PARTICLES FROM A PLASMA

Figure 1:
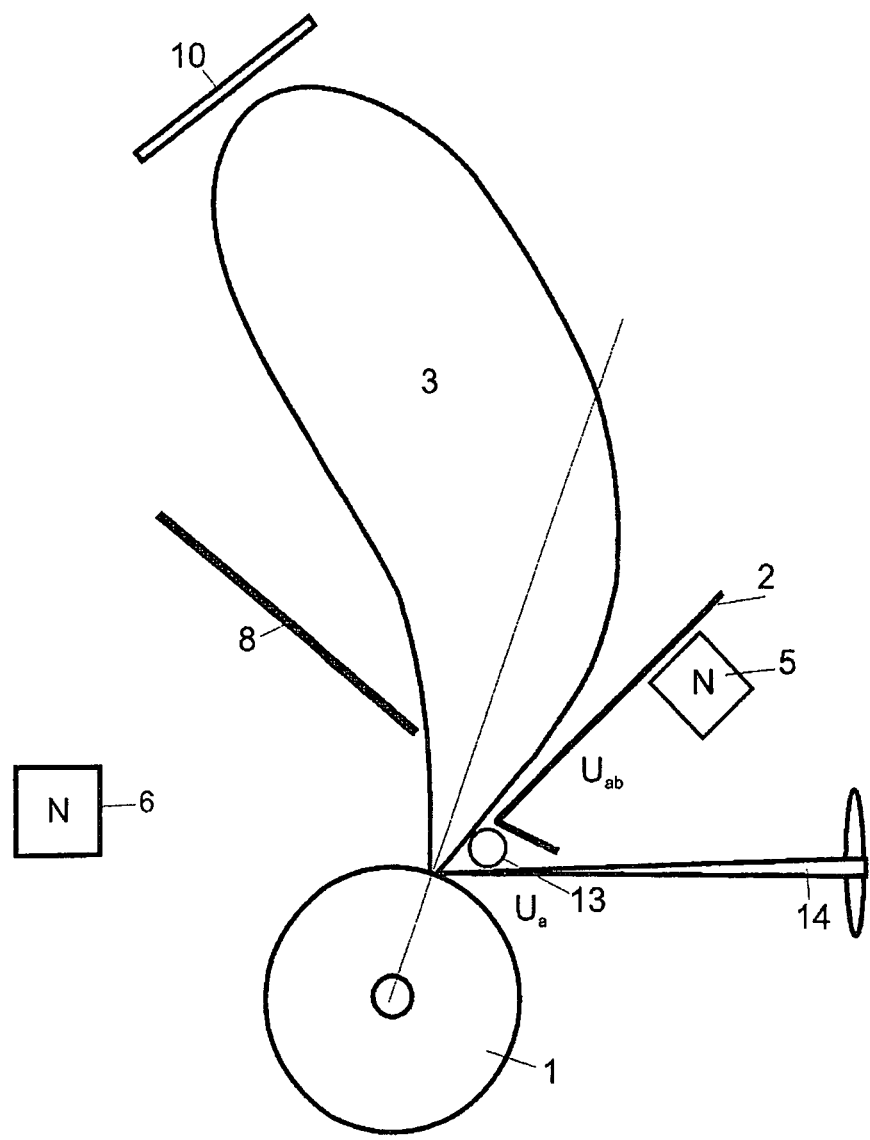

The invention relates to an arrangement for the separation of particles from a plasma used for the coating of substrates under vacuum conditions. It can be used particularly advantageously in a method in which the plasma is formed by means of electrical arc discharge since it is known that the proportion of larger particles in the plasma is high and that they have a disadvantageous effect on the forming of coatings on substrates as so-called "droplets".

The layer quality is thus degraded and frequently too high a roughness of the surfaces is present which can make a mechanical reworking necessary. The latter is, however, not possible or only possible with a very high effort with layers made of hard materials such as amorphous carbon, also called diamond-like carbon.

Different solution approaches have been given to counter this problem. In this connection, the use of an absorber electrode was proposed in WO 00/13201 A1 with which a positive influence, that is a reduction in the number of particles incident onto a forming layer, can be achieved.

Building on this principle, it was proposed in DE 102 40 337 A1 additionally to form a magnetic or electromagnetic field. Specifically, two permanent magnets or electrical coils should be used between which a plasma formed by target should be guided.

In this connection, the spacing of the magnets or coils can, however, not be selected as desired to ensure a sufficiently large field strength in the plasma volume. This in particular has a disadvantageous effect with large targets, in particular elongated targets, which are, however, desired for the coating of large-area substrates or of a plurality of substrates to be coated.

In the technology known as the "laser arc technique", elongated, roller-shaped targets are frequently used whose length is from 300 mm and above. In this connection, a pulsed arc discharge is ignited in a locally direct manner by means of a laser beam directed onto the rotating surface of a target. Said arc discharge breaks down again after a pre-settable time and subsequently a repeat ignition is initiated at another site of the target surface. A very uniform removal of material from the target and an effective coating of substrates can thus be achieved.

With such large targets, however, an apparatus known from DE 102 40 337 cannot be used without problem and a plurality of systems have to be arranged next to one another in series, which is extremely disadvantageous for operation and is frequently also not practical.

It is therefore the object of the invention to propose a solution which is easy to realize and with which particles can be separated from a plasma made for the formation of coatings such that they are not incident onto the surface of a substrate to be coated, with large targets being able to be used for the plasma formation.

This object is solved in accordance with the invention by an arrangement having the features of claim 1. Advantageous aspects and further developments of the invention can be achieved using features designated in the subordinate claims.

In the arrangement in accordance with the invention, a plasma is formed from a target that can be connected as a cathode and positive charge carriers of the plasma are accelerated in this process in the direction of a surface of a substrate to be coated by means of at least one absorber electrode connected to an electrical potential positive with respect to the plasma. In this connection, the absorber electrode should be arranged and orientated such that a direct incidence of plasma onto the absorber electrode is avoided. The absorber electrode can thus, for example, be designed in plate form or in a similar form and can be aligned at an obliquely inclined angle which takes account of the divergence of the plasma flow.

In addition, at least one permanent magnet element or electromagnet is a component of the arrangement and is arranged such that the plasma accelerated in the direction of a substrate is guided between the absorber electrode and the permanent magnet element or electromagnet. The absorber electrode is therefore arranged between the bar-shaped permanent magnet element or electromagnet and the plasma.

The permanent magnet element or the electromagnet are dimensioned such that it is guided at least up to the lateral outer edges of the absorber electrode and the length of a target useful for the plasma formation is taken into account.

A field which is being formed can thereby also influence the plasma accelerated in the direction of the substrate.

The magnetic potential can be optimized by a suitable choice of the length of the permanent magnet element or electromagnet since it is proportional to the respective length. The magnetic field strength is therefore also constantly high in the region of the plasma.

The invention can also be further developed in that a second permanent magnetic element or a second electromagnet is used. In this connection, an arrangement behind or in the shadow of the absorber electrode should be selected. The absorber electrode is therefore arranged between the bar-shaped permanent magnet element or electromagnet and the plasma.

This takes the circumstances into account that the magnetic field strength drops perpendicular to the longitudinal axis of magnets. A homogenization of the magnetic field can thus be achieved.

This second permanent magnet element or electromagnet should have the same outline dimensions, magnetic properties/parameters and so also have the same orientation of the polarity.

Permanent magnet elements can be formed with stacked single permanent magnets and the respectively required length can thus be achieved.

An advantageous embodiment can, however, also be configured such that a second permanent magnet element or an electromagnet with opposite pole orientation to the first can be used and arranged together with a second absorber electrode such that the plasma is guided between these two part units each made in the same manner. This takes the circumstance into account that the magnetic field strength drops perpendicular to the longitudinal axis of magnets.

The plasma can be influenced from two sides and can be compacted and restricted, that is so-to-say focused, using such a configuration.

A diaphragm with a free gap can then advantageously be arranged in the region of the restriction of the plasma by which plasma, in which a large proportion of particles has already been separated, is directed onto a surface of a substrate to be coated and particles are kept back by the diaphragm. A reduction in particles reaching the substrate by a factor of 5 can thus be achieved without changing the direction of the plasma.

However, there is still also the possibility of additionally using a further permanent magnet element or electromagnet. It should be arranged between the first and second permanent magnet elements or electromagnets and the substrate such that a deflection of the plasma flow in the direction of a substrate arranged with a corresponding offset can be achieved with its assistance. Such a third permanent magnet element or third electromagnet should be arranged, in the direction of the plasma flow, after the restriction and preferably behind the gap-shaped diaphragm next to the plasma flow.

The individual permanent magnet elements or electromagnets should have a field strength of at least 10 mT.

The coating can be operated using the process already described in the introduction to the description. In this process, plasma can be generated by means of electrical arc discharge which is ignited at the surface of a target. This can take place in pulsed form. At least one anode is arranged in the proximity of the target. The ignition can again be initiated in a locally direct manner using a deflectable laser beam. The target can rotate around an axis.

Permanent magnet elements or electromagnets should preferably be aligned parallel to the axis of rotation. Their length should correspond to or be larger than the length of the target in the direction of the axis of rotation. The length should also be larger than the dimensions of the absorber electrode(s) in this direction so that they project beyond it/them.

The invention should be explained in more detail in the following with reference to examples.

Figure 2:
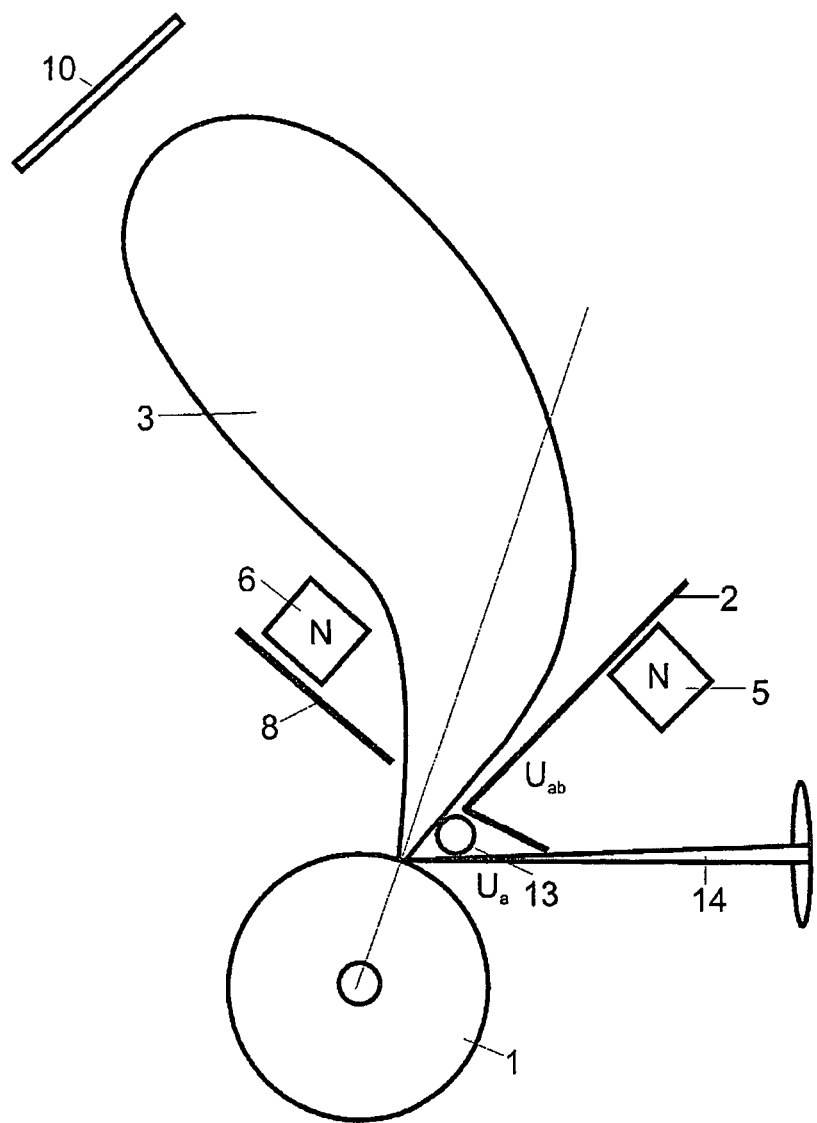
Figure 3:
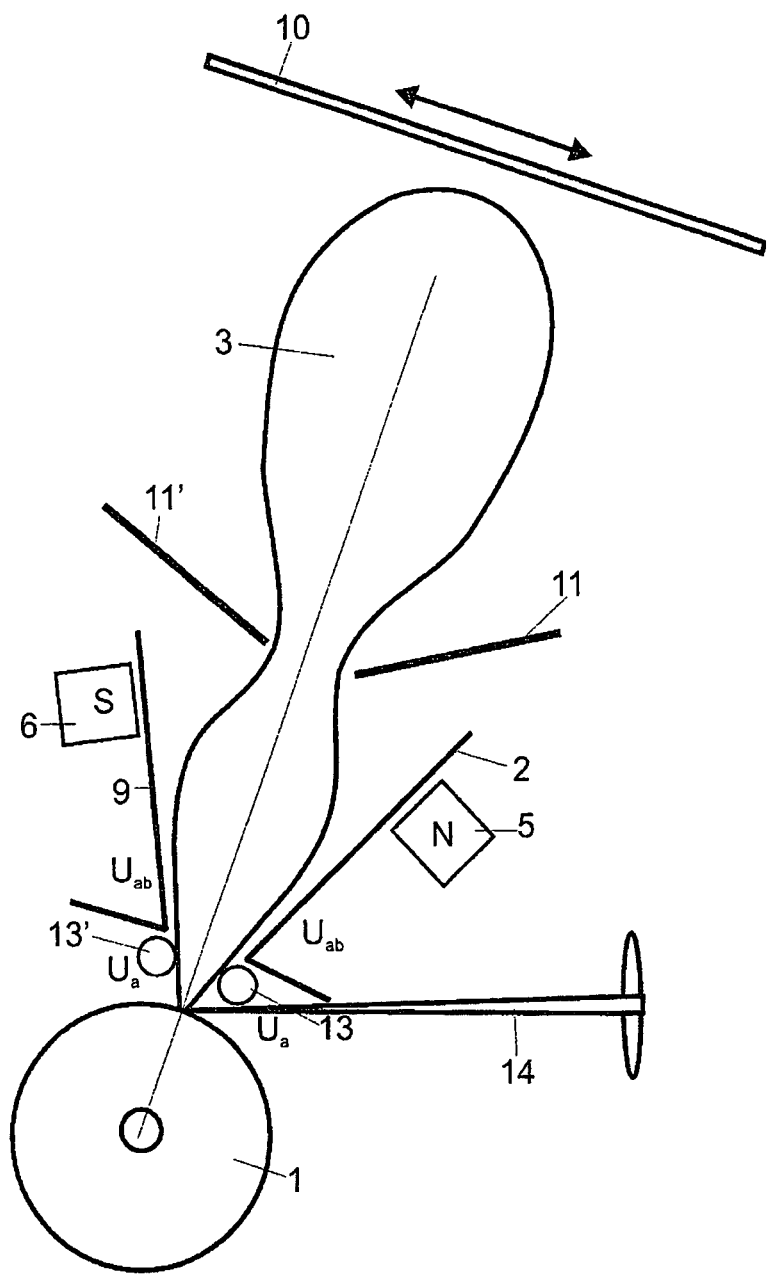
Figure 4:
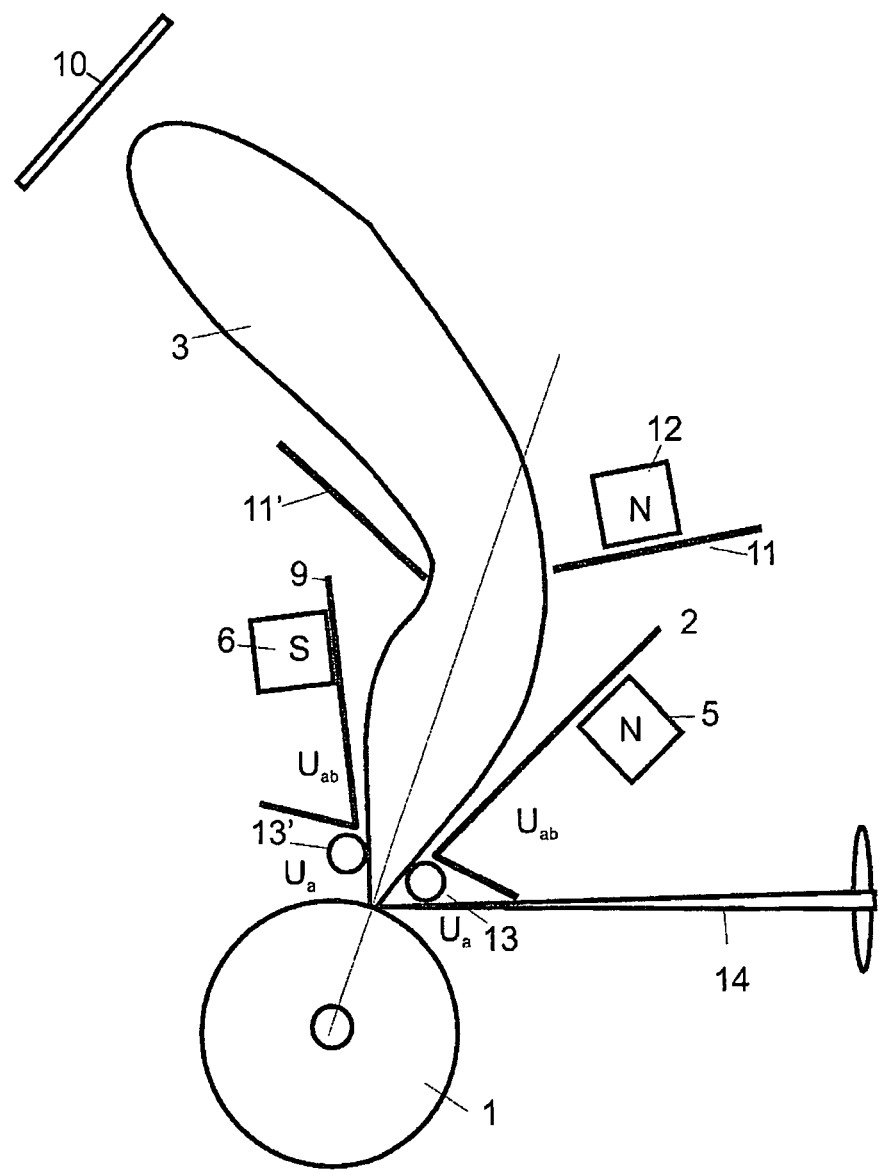
Figure 5:
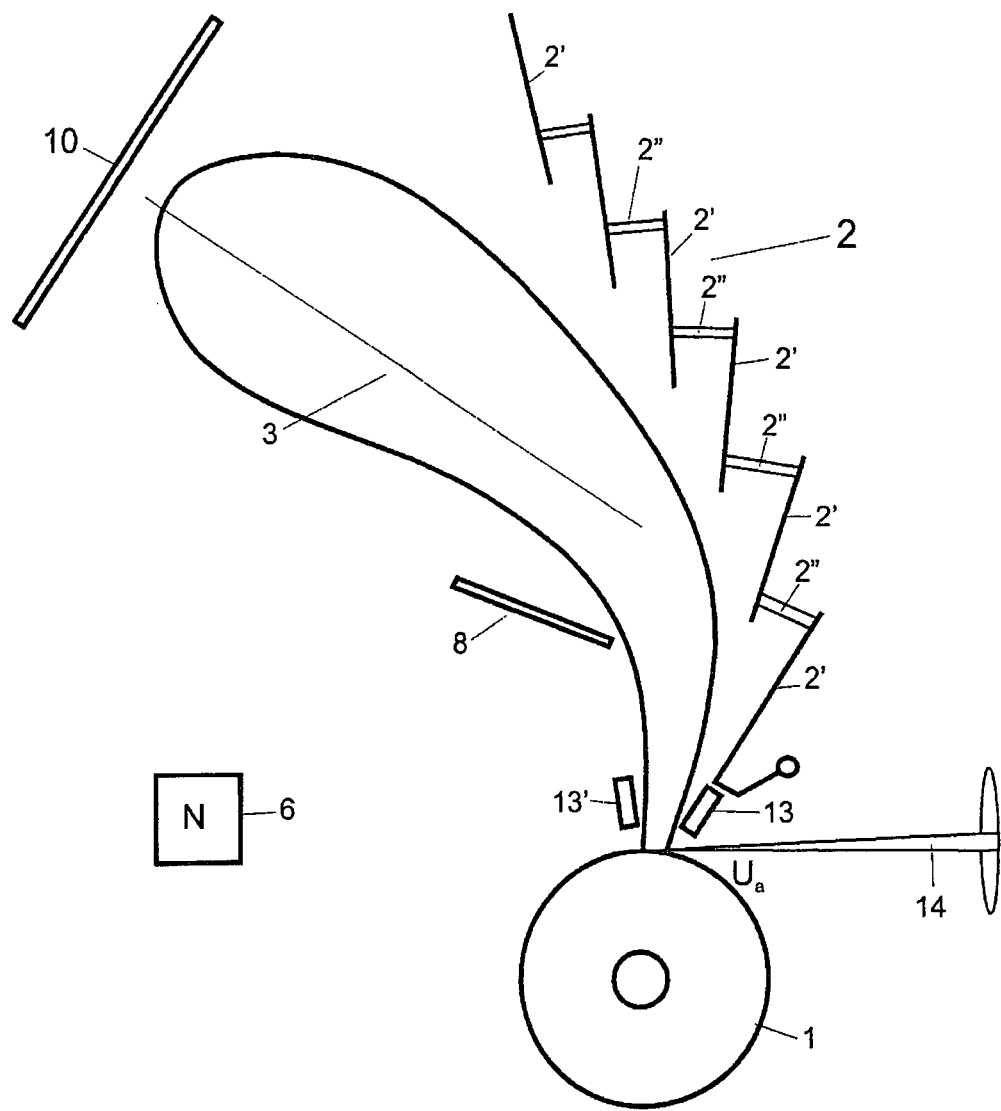
Figure 6:
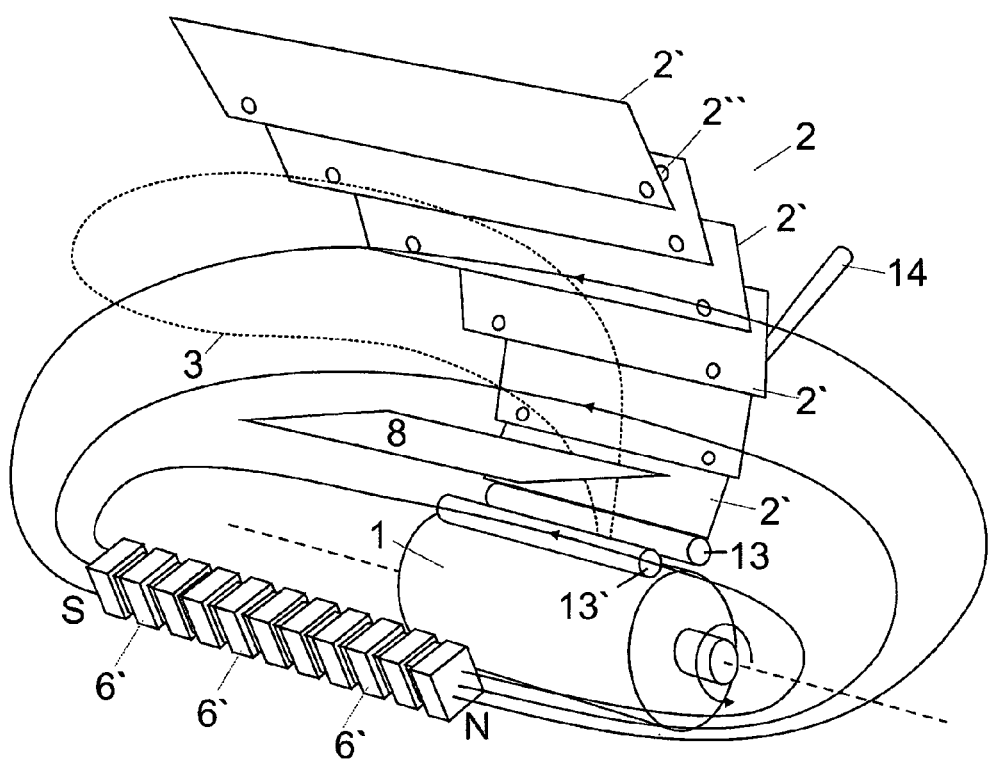

There are shown:

FIG. 1, an example of an arrangement in accordance with the invention with an absorber electrode and a permanent magnet element;

FIG. 2, an example supplemented by a further permanent magnet element;

FIG. 3, an example with two permanent magnet elements and two absorber electrodes;

FIG. 4, an example with three permanent magnet elements;

FIG. 5, a further example with an absorber electrode formed with strip-shaped elements; and FIG. 6 is a perspective view of FIG. 5 showing a plurality of stacked magnets.

In FIG. 1, an example is shown in which a rotating roller-shaped target 1 is used. In this connection, plasma 3 is formed by means of pulsed arc discharge from the target 1. For this purpose, an anode 13 is arranged in the proximity of the target 1. The anode 13 extends over the total useful length of the target 1 into the drawing plane. This length amounts to 400 mm here. The ignition can be started locally using the laser beam 14.

In addition, an absorber electrode 2 is present which is connected to a potential which is electrically positive with respect to the plasma 3. This can be a correspondingly angled metal sheet. As can be seen from the representation, it is aligned in an obliquely inclined angle to avoid a direct incidence of components of the plasma.

A second bar-shaped permanent magnet element 5 and a first permanent magnet electrode 6 are arranged behind the absorber electrode 2 such that accelerated plasma 3 is guided in the direction of the substrate 10 between the absorber electrode 2 and the first permanent magnet element 6. The length of the two permanent magnet elements 5 and 6 is somewhat larger, e.g. 200 mm larger, than the length of the absorber electrode 2 in the direction of the axis of rotation of the target 1 so that they project beyond its outer edges with its front faces.

On the side of the plasma 3 disposed opposite the absorber electrode 2, that is in the direction in which the plasma 3 is deflected, a diaphragm 8 is arranged with which separated particles can be trapped.

In the example shown in FIG. 2, a first permanent magnet element 6 is arranged in the plasma shadow of the diaphragm 8 and has the same pole alignment as the second permanent magnet element 5, is aligned and dimensioned the same and has the same magnetic parameters.

In the example in accordance with FIG. 3, a symmetrical design around the flow of the plasma 3 in the direction of the substrate 10 has been selected. Two anodes 13, 13', two absorber electrodes 2 and 9 as well as two permanent magnet elements 5 and 6 are arranged at the target 1 on two oppositely disposed sides of the plasma 3. Only the pole alignment of the permanent magnet elements 5 and 6 has been selected to be oppositely disposed.

As can be seen from the representation, a compacting in the form of a restriction of the plasma flow 3 can thereby be achieved. The restriction of the plasma flow 3 is configured in a region in which a diaphragm 11 with a gap is arranged. The gap extends parallel to the axis of rotation of the target 1 over its length. A change in direction of the plasma flow 3 in the direction of a substrate 10 arranged in an offset manner does not necessarily take place in this example.

However, this can be achieved with a third permanent magnet element 12, as is shown in FIG. 4. It is arranged at a side of the plasma flow 3 in the proximity of the restriction and arranged here in the shadow of part of the diaphragm 11. The direction of the plasma flow 3 toward a substrate 10 arranged correspondingly offset can be changed by this permanent magnet element 12 and the separation effect can be further increased.

A further example of an arrangement in accordance with the invention is shown schematically in FIG. 5. In this context, anodes 13 and 13' are arranged above a target 1 to initiate electrical arc discharges whose ignition can take place in a locally defined manner by means of pulsed laser radiation 14. The absorber electrode 2 is made with a plurality of strip-shaped elements 2' which are electrically conductively connected to one another. The strip-shaped elements 2' are provided with spacers 2". Heavier particles or particulates can pass through the intermediate spaces formed in this manner between the strip-shaped elements 2' without any reflection taking place in the direction toward the surface of a substrate 10.

An arcuate shape of the absorber electrode 2 in the direction toward a substrate 10 arranged laterally to the target 1 can be formed by an angular alignment of strip-shaped elements 2' differing from one another.

The plasma 3 formed and accelerated in the direction of a substrate 10 is guided between the absorber electrode 2 and the first permanent magnet element 6 and is deflected free of larger particles or particulates in the direction of the substrate 10 arranged to the side of the target 1.

A diaphragm 8 is also present in this example and is arranged on the same side with respect to the plasma 3 as also the first permanent magnet element 6.

The electrical contacting of the absorber electrode 2 to an electrical voltage supply is arranged in the proximity of its foot point and accordingly also in the proximity of the anode 13.

The invention claimed is:

1. An arrangement for the separation of particles from a plasma for the formation of a coating onto the surface of a substrate under vacuum conditions, wherein a plasma is formed from a target by pulsed laser or arc discharge and positive charge carriers of the plasma are accelerated to coat the substrate by an absorber electrode connected to an electrically positive potential with respect to the plasma, said substrate spaced from said target, said absorber electrode being arranged and aligned such that a direct incidence of components of the plasma is avoided, said arrangement comprising said target in the shape of an elongated rotatable cylindrical roller defining an axis of rotation, said absorber electrode having a length and disposed angularly with regard to, and spaced from, said cylindrical roller of said target and an elongated bar-shaped first magnet element, comprising a permanent magnet or an electromagnet, having a length equal to or longer than the length of said target and equal to or longer than the length of said absorber electrode and wherein said elongated bar-shaped first magnet element is aligned such that its length is parallel to the axis of rotation of said target and disposed adjacent to and spaced from the circumference of said cylindrical roller of the target and positioned angularly away from said absorber electrode around the circumference of said cylindrical roller to define a space between said first magnet element and said absorber electrode, said substrate positioned within said space between said absorber electrode and said first magnet element, said first magnet element located between said target and said substrate, said absorber electrode located between said target and said substrate, and wherein the space between said first magnet element and said absorber electrode is arranged such that plasma accelerated from the target in the direction of said substrate is guided between the absorber electrode and the elongated bar-shaped first magnet element to said substrate.

2. An arrangement in accordance with claim 1, wherein the absorber electrode is arranged between the plasma accelerated in the direction of the substrate and an elongated bar-shaped second magnet element, said second magnet element comprising a permanent magnet or an electromagnet.

3. An arrangement in accordance with claim 2, wherein the elongated bar-shaped first and the second magnet elements have the same pole alignment.

4. An arrangement in accordance with claim 1, further comprising a diaphragm positioned to form a gap with respect to said absorber electrode through which said plasma is directed, said elongated bar-shaped first magnet element is arranged adjacent said diaphragm.

5. An arrangement in accordance with claim 2, wherein a second absorber electrode is arranged on the side of the plasma disposed opposite said absorber electrode and the elongated bar-shaped first magnet element is arranged behind the second absorber electrode and has an opposite pole alignment to the elongated bar-shaped second magnet element.

6. An arrangement in accordance with claim 2, further comprising a gap-shaped diaphragm arranged between the elongated bar-shaped first and second magnet element and the substrate.

7. An arrangement in accordance with claim 2, further comprising a third magnet element arranged between the first and/or second magnet elements and the substrate for the lateral deflection of the plasma in the direction of the substrate arranged in an offset manner.

8. An arrangement in accordance with claim 7, wherein the third magnet element is arranged in the region of a restriction of the plasma formed by the influence of the first and second magnet elements.

9. An arrangement in accordance with claim 1, wherein said elongated bar-shaped first magnet element is formed by a plurality of stacked single permanent magnets.

10. An arrangement in accordance with claim 1, further comprising at least one anode arranged between the absorber electrode and the target for the formation of an arc discharge.

11. An arrangement in accordance with claim 1, wherein a laser beam is directed to the surface of the target for the ignition of arc discharges.

12. An arrangement in accordance with claim 1, wherein said elongated bar-shaped first magnet element has a magnetic field strength of at least 10 mT.

13. An arrangement in accordance with claim 2, wherein the absorber electrode is formed with strip-shaped elements which are electrically conductively connected to one another, are arranged at intervals from one another and are aligned parallel to the axis of rotation of the target or to the longitudinal axis of said second magnet element.

14. An arrangement in accordance with claim 13, wherein the strip-shaped elements are aligned in inclination angles which differ from one another and the inclination angles increase starting from said absorber electrode in the direction of a substrate arranged to the side thereof, thus making the absorber electrode in arcuate form.

15. An arrangement in accordance with claim 14, wherein the absorber electrode is connected to an electrical voltage supply.

* * * * *